US006043103A

United States Patent [19]

Takemura

[11] Patent Number: 6,043,103

[45] Date of Patent: Mar. 28, 2000

[54] FIELD-EMISSION COLD CATHODE AND METHOD OF MANUFACTURING SAME

[75] Inventor: Hisashi Takemura, Tokyo, Japan

[73] Assignee: NEC Corporation, Tokyo, Japan

[21] Appl. No.: 09/094,813

[22] Filed: Jun. 15, 1998

[30] Foreign Application Priority Data

Jun. 25, 1997 [JP] Japan .................................... 9-168938

[51] Int. Cl.$^{7}$ ...................................................... H01L 21/00

[52] U.S. Cl. ................................. 438/20; 445/46; 445/49; 445/50; 445/51

[58] Field of Search ................................ 438/20; 445/46, 445/49–51

[56] References Cited

U.S. PATENT DOCUMENTS 4,168,213 9/1979 Hoeberechts .............................. 204/15
5,266,530 11/1993 Bagley et al. .......................... 437/228
5,775,968 7/1998 Toyoda et al. ............................ 445/24

FOREIGN PATENT DOCUMENTS 5-94762 4/1993 Japan .
6-52788 2/1994 Japan .
07065706 3/1995 Japan .
08321255 12/1996 Japan .
2614983 2/1997 Japan .

OTHER PUBLICATIONS

Japanese Office Action, dated Aug. 10, 1999, with English language translation of Japanese Examiner's comments.

*Primary Examiner*—John F. Niebling
*Assistant Examiner*—David A. Zarneke
*Attorney, Agent, or Firm*—Whitham, Curtis & Whitham

[57] ABSTRACT

A field-emission cold cathode includes a substrate having a sharply pointed emitter disposed on a surface thereof and serving as an emitter electrode, an insulating film disposed on the substrate, and a gate electrode disposed on the insulating film and having an opening defined therein and having an edge surrounding the emitter. The gate electrode and the emitter are spaced from each other across a cavity near the emitter. The insulating film and the substrate have a boundary surface therebetween which is lower than the surface of the substrate. The substrate has a step positioned between the boundary surface and the surface of the substrate on which the emitter is disposed, the step being disposed between the insulating film and the emitter. The insulating film supports the gate electrode and has a thickness greater than the distance between the emitter and the gate electrode.

6 Claims, 11 Drawing Sheets

FIELD-EMISSION COLD CATHODE AND METHOD OF MANUFACTURING SAME

BACKGROUND OF THE INVENTION

1. Field of the Invention

The present invention relates to a field-emission cold cathode and a method of manufacturing such a field-emission cold cathode, and more particularly to a field-emission cold cathode having a sharply pointed emitter and a method of manufacturing such a field-emission cold cathode.

2. Description of the Related Art

Field-emission cold cathodes comprise a sharply pointed conical emitter and a gate electrode having an opening of submicroscopic size and disposed in the vicinity of the emitter. In operation, a high electric field is concentrated on the tip end of the emitter to enable the tip end of the emitter to emit electrons toward a separate anode electrode.

With the development of the microelecronic fabrication technology, field-emission cold cathodes have become smaller and smaller in size, and have found wide usage as components in ultrasmall triode electron tubes and ultrasmall electron guns of flat display panels.

Conventional field-emission cold cathodes operate such that when a voltage of about 100 V is applied between the emitter and the gate electrode, electrons are emitted from the emitter which has a small radius of curvature that is of about 10 nm. If the operating voltage were higher than 100 V, then operating conditions of the field-emission cold cathodes would be limited by the power consumption and a control circuit connected thereto. Consequently, field-emission cold cathodes have been desired to operate under lower voltages. One solution is to reduce the diameter of the opening of the gate electrode. If the diameter of the opening of the gate electrode were simply reduced, then the thickness of an insulating film between the gate and the emitter would also be reduced, resulting in a reduction in the dielectric strength. Therefore, it is necessary to reduce the diameter of the opening of the gate electrode while minimizing a reduction in the dielectric strength.

Prior efforts to reduce the diameter of the opening of the gate electrode are disclosed in Japanese laid-open patent publications Nos. 5-94762, 8-321255, and 7-65706, for example.

Japanese laid-open patent publication No. 5-94762 reveals a method of manufacturing a field-emission cold cathode (first conventional method). The disclosed method will be described below with reference to FIGS. 1A through 1D of the accompanying drawings. As shown in FIG. 1A, the surface of a silicon substrate 701 is thermally oxidized into an oxide insulating film 702 having a thickness ranging from 0.2 to 0.3 μm. Then, as shown in FIG. 1B, the surface of the insulating film 702 is patterned using a resist, and etched to a desired shape. Using the etched insulating film 702, the surface of the silicon substrate 701 is isotropically etched by a dry etching process, forming a convex region 701*a* beneath the insulating film 702. As shown in FIG. 1C, the surface of the silicon substrate 701 is thermally oxidized into an oxide insulating film 703 having a thickness ranging from 0.3 to 0.5 μm. At this time, the surface of the convex region 701*a* is also oxidized, forming a conical emitter 704 underneath the oxide film of the convex region 701*a*. Then, a gate electrode material 707*a* of molybdenum or the like is deposited to a thickness of about 0.2 μm on the surface formed so far by oblique rotary electron beam evaporation, forming a gate electrode 707 on the insulating film 703. As shown in FIG. 1D, the insulating film 702 and the insulating film 703 on the emitter 704 are removed by hydrofluoric acid. The gate electrode material 707*a* on the emitter 704 is lifted off, exposing the emitter 704. In this manner, a field-emission cold cathode is manufactured.

According to the first conventional method, the insulating film 703 beneath the gate electrode 707 is made of a highly insulative thermal oxide film thereby to reduce the distance between the emitter 704 and the gate electrode 707.

A second conventional method disclosed in Japanese laid-open patent publication No. 8-321255 will be described below with reference to FIGS. 2A through 2D of the accompanying drawings. As shown in FIG. 2A, an insulating film 803 such as a thermal oxide film is formed on a silicon substrate 801, and an insulating film 814 such as a nitride film is deposited to a thickness of 0.2 μm on the insulating film 803 by CVD. A gate electrode 807 of molybdenum or the like is then deposited to a thickness of 0.2 μm on the insulating film 814 by sputtering. Then, as shown in FIG. 2B, a photolithography resist (not shown) is patterned and used as a mask to form circular openings in the gate electrode 807, the insulating film 814, and the insulating film 803 according to RIE. The edge of the opening in the insulating film 803 is retracted away from the edges of the openings in the gate electrode 807 and the insulating film 814 by hydrofluoric acid according to selective wet etching. Then, as shown in FIG. 2C, a release layer 812 of aluminum or the like is deposited by oblique electron beam evaporation, and thereafter an emitter material layer 813 of molybdenum or the like is deposited by vertical electron beam evaporation. When the emitter material layer 813 is deposited, a sharply pointed emitter 804 is formed in the openings on the silicon substrate 801. As shown in FIG. 2D, the release layer 812 is etched by phosphoric acid, and the emitter material layer 813 is lifted off, thereby completing a field-emission cold cathode.

According to the second conventional method, the two insulating films 803, 814 of different materials are disposed underneath the gate electrode 807, and one of the insulating films 803, 814 is side-etched to increase the surface distance of these insulating films for thereby increasing the insulation between the gate electrode 807 and the emitter 804 or the silicon substrate 801.

A third conventional method disclosed in Japanese laid-open patent publication No. 7-65706 will be described below with reference to FIGS. 3A through 3D of the accompanying drawings. As shown in FIG. 3A, a nitride film 917 having a thickness of 300 nm and an oxide film 918 having a thickness of 300 nm are successively deposited on a silicon substrate 901 by CVD. Then, the oxide film 918 and the nitride film 917 are patterned by photolithography. Using the patterned film 918, 918 as a mask, the silicon substrate 901 is initially isotropically etched and then anisotropically etched with an etching gas of SF6 or the like, forming a convex region 901*a* with its tip end tapered on the silicon substrate 901. Then, as shown in FIG. 3B, the silicon substrate 901 is thermally oxidized to form an insulating film 903 comprising an oxide film on the surface thereof. In the thermally oxidizing process, the tip end of the convex region 901*a* is further tapered, forming an emitter 904. A portion of the insulating film 903 which is formed on the side wall of the emitter 904 is wider than the films 917, 918 used as a mask. Thereafter, as shown in FIG. 3C, an insulating film 919 comprising an oxide film having a thickness of 1 μm is deposited on the surface formed so far by an evaporation process. In this evaporation process, the insulating film 919 is deposited on an upper region of the portion of the insulating film 903 on the side wall of the emitter 904 which is wider than the films 917, 918, producing a collar-like growth portion 919*a*. Then, a gate electrode 907 of chrominum or the like is obliquely deposited to a thickness of 200 nm on the surface formed so far. The gate electrode 907 is deposited also on the collar-like growth portion 919*a*, and extends onto the insulating film 903 in a region closest to the emitter 904. Thereafter, as shown in FIG. 3D, the insulating film 903 is etched by hydrofluoric acid, lifting off the films 917, 918, the insulating film 919 thereon, and a gate electrode material layer 907*a* thereon. The emitter 904 is now exposed through the gate electrode 907, thus completing a field-emission cold cathode.

According to the third conventional method, the distance between the gate electrode 907 and the emitter 904 can be reduced using the collar-like growth portion 919*a*.

The conventional methods described above suffer certain problems as described below. The first problem is associated with the first conventional method in which the insulating film beneath the gate electrode comprises a highly insulative thermal oxide film and the distance between the gate electrode and the emitter is determined by the thickness of the oxide film. In the first conventional method, the dielectric strength along the surface of the insulating film is lowered as the size of the field-emission cold cathode is reduced. Since the distance between the gate electrode and the emitter is determined by the thickness of the thermal oxide film, the dielectric strength along the surface of the insulating film is sufficiently large if the thickness of the thermal oxide film is greater than a certain value. As the distance between the gate electrode and the emitter is reduced, the creeping distance along the surface of the insulating film between the gate electrode and the emitter, which depends upon the thickness of the thermal oxide film, is shortened. Consequently, the dielectric strength between the gate electrode and the emitter is lowered due to a discharge and a leakage current along the shortened creeping distance.

The second problem is that the dielectric strength of the insulating film is reduced as the size of the field-emission cold cathode is reduced. According to the first conventional method in which the diameter of an opening in the gate electrode is determined by the thickness of the insulating film, the thickness of the insulating film tends to be small, and the dielectric strength is lowered on account of crystal defects present in the insulating film. According to the second conventional method in which the emitter is deposited by evaporation, as the diameter of the opening in the gate electrode is reduced, the height of the emitter is also reduced. Therefore, unless the height of the gate electrode is lowered in proportion to the height of the emitter, emission current characteristics are degraded. Accordingly, the thicknesses of the insulating films need to be reduced. The dielectric strength cannot be increased simply by employing two or more insulating films and side-etching one of the insulating films to increase the creeping distance along the surfaces of the insulating films.

The third problem is that if the width of the opening in the gate electrode is reduced by changing the configuration of the insulating film near the emitter, then the mechanical strength of the gate electrode is reduced, making unstable the distance between the gate electrode and the emitter. Specifically, according to the third conventional method in which the gate electrode material is deposited behind the other films, its thickness may be locally changed and the gate electrode tends to be subject to a local reduction in the mechanical strength and broken or otherwise damaged.

The fourth problem is that if the distance between the gate electrode and the emitter is reduced by changing the configuration of the gate electrode on the insulating film near the emitter, then the intensity of the electric field at the tip end of the emitter varies, resulting in unstable characteristics. Specifically, if the gate electrode is of a raised structure near the emitter as with the third conventional method, then the potential distribution of an upper portion of the emitter is affected by a potential determined by the raised structure, and the potential distribution of the tip end of the emitter is coarse. As a result, the intensity of the electric field at the tip end of the emitter is lowered, reducing an emission current.

SUMMARY OF THE INVENTION

It is therefore an object of the present invention to provide a field-emission cold cathode in which the dielectric strength between a gate electrode and an emitter is prevented from being lowered, and a distance between the gate electrode and the emitter is reduced for lowering an operating voltage, and a method of manufacturing such a field-emission cold cathode.

According to the present invention, there is provided a field-emission cold cathode comprising a substrate having a sharply pointed emitter disposed on a surface thereof and serving as an emitter electrode, an insulating film disposed on the substrate, and a gate electrode disposed on the insulating film and having an opening defined therein and having an edge surrounding the emitter, the gate electrode and the emitter being spaced from each other across a cavity near the emitter, the insulating film and the substrate having a boundary surface therebetween which is lower than the surface of the substrate, the substrate having a step positioned between the boundary surface and the surface of the substrate on which the emitter is disposed, the step being disposed between the insulating film and the emitter, the insulating film supporting the gate electrode and having a thickness greater than the distance between the emitter and the gate electrode.

The field-emission cold cathode may further comprise an insulating film disposed on a surface of the gate electrode which faces the emitter across the cavity and/or a surface of the substrate which defines the cavity.

According to the present invention, there is also provided a method of manufacturing a field-emission cold cathode having a substrate having a sharply pointed emitter disposed on a surface thereof and serving as an emitter electrode, an insulating film disposed on the substrate, and a gate electrode disposed on the insulating film and having an opening defined therein and having an edge surrounding the emitter, the method comprising the steps of forming a convex region on a silicon substrate using a mask disposed on the silicon substrate, forming a second oxide film as an insulating film on the surface of the silicon substrate to form a sharply pointed emitter from the convex region beneath the second oxide film, forming a first oxide film as an insulating film in the silicon substrate beneath the second oxide film, using a mask disposed on the second oxide film, the first oxide film having an inner end providing a step on the silicon substrate, forming a gate electrode on the second oxide film and having an opening defined therein and having an edge surrounding the emitter, and selectively etching the first oxide film and the second oxide film laterally in the opening to a position beyond the step for thereby defining a cavity between the gate electrode and the silicon substrate.

According to the present invention, there is further provided a method of manufacturing a field-emission cold cathode having a substrate having a sharply pointed emitter disposed on a surface thereof and serving as an emitter electrode, an insulating film disposed on the substrate, and a gate electrode disposed on the insulating film and having an opening defined therein and having an edge surrounding the emitter, the method comprising the steps of forming a first oxide film as an insulating film in a silicon substrate, using a mask disposed on the silicon substrate, the first oxide film having an inner end providing a step on the silicon substrate, forming a second oxide film as an insulating film on the silicon substrate over the first oxide film, forming a gate electrode on the second oxide film, defining an opening in the second oxide film and the gate electrode, selectively etching the first oxide film and the second oxide film laterally in the opening to a position beyond the step for thereby defining a cavity between the gate electrode and the silicon substrate, and depositing an emitter material on the silicon substrate below the opening through the opening for thereby forming an emitter in the opening.

Each of the above methods may further comprise the steps of, before forming the gate electrode on the second oxide film, forming a third insulating film on the second oxide film, the third insulating film having a different etching rate from the second oxide film, and forming the gate electrode on the third insulating film.

Each of the above methods may further comprise the steps of, after defining the cavity between the gate electrode and the silicon substrate, forming a fourth insulating film on an entire surface formed so far, and selectively removing a portion of the fourth insulating film except an area thereof which is deposited on a surface in the cavity outwardly of the opening.

Since the cavity is defined between the emitter and the gate electrode near the emitter, and the boundary surface between the insulating film and the substrate is lower than the surface of the substrate on which the emitter is formed, the step positioned between the boundary surface of the surface of the substrate is formed between the insulating film and the emitter. The thickness of the insulating film which supports the gate electrode is greater than the distance between the emitter and the gate electrode across the cavity, providing greater insulation between the emitter and the gate electrode. The operating voltage of the field-emission cold cathode may be lowered as the distance between the emitter and the gate electrode is reduced.

Furthermore, if an insulating film is formed on at least one of the gate electrode and the silicon substrate within the cavity near the emitter, then the creeping distance of the insulating film between the silicon substrate and the gate electrode is increased, increasing the dielectric strength between the emitter and the gate electrode along the surface therebetween.

With the method according to the present invention, the step of selectively oxidizing the silicon substrate is added to the conventional method to produce a field-emission cold cathode.

If the field-emission cold cathode according to the present invention, which has a high dielectric strength and can operate under a low voltage, is incorporated in a display device, e.g., a flat display panel, a display cathode-ray tube, or the like, then the display device has stable current characteristics.

The above and other objects, features, and advantages of the present invention will become apparent from the following description based on the accompanying drawings which illustrate an example of preferred embodiments of the present invention.

DETAILED DESCRIPTION OF THE PREFERRED EMBODIMENTS

A field-emission cold cathode according to a first embodiment of the present invention and a method of manufacturing the field-emission cold cathode will be described below with reference to FIGS. 4, 5, and 6A–6D.

Figure 4:
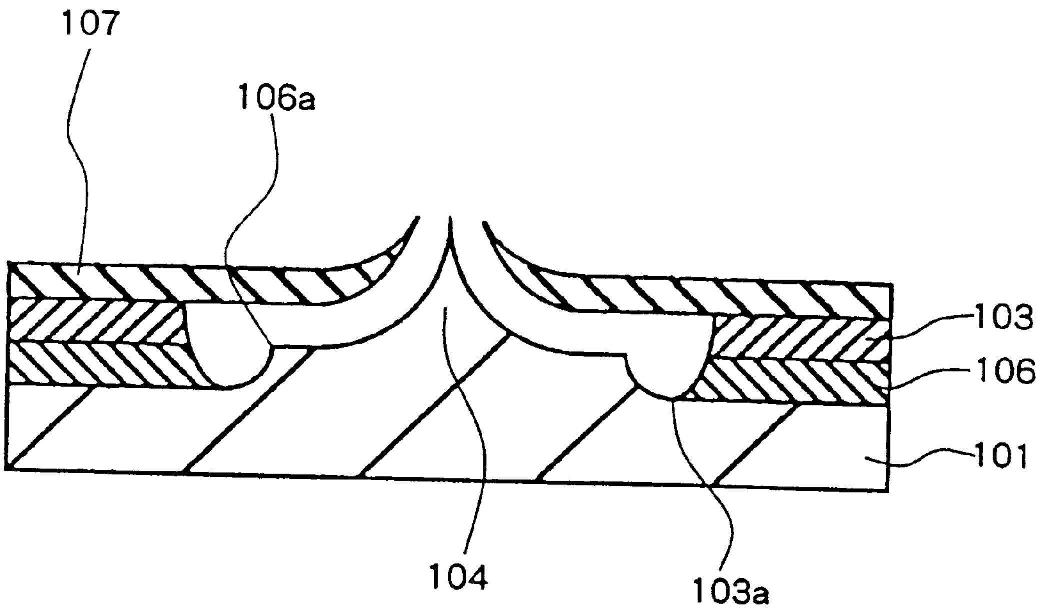
FIG. 4 is a schematic cross-sectional view of a field-emission cold cathode according to a first embodiment of the present invention, taken along line IV—IV of FIG. 5.
Figure 5:
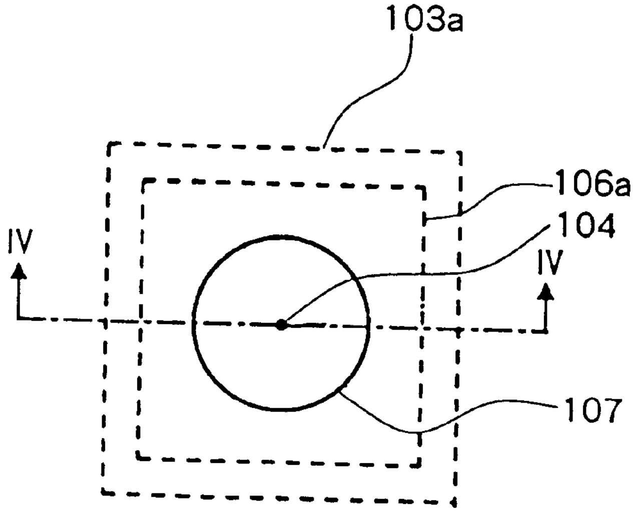
FIG. 5 is a schematic plan view of the field-emission cold cathode shown in FIG. 4.

As shown in FIGS. 4 and 5, the field-emission cold cathode according to the first embodiment comprises an n-type silicon substrate 101 having a convex step 106*a* and an emitter 104 on its upper surface, a gate electrode 107 and insulating films 103, 106 which are disposed on the silicon substrate 101 in surrounding relation to the emitter 104.

The emitter 104 is disposed inwardly of the convex step 106*a*. The insulating films 103, 106 and an insulating electrode end 103*a* are disposed outwardly of the convex step 106*a*. Specifically, the boundary surface between the insulating films 103, 106 and the silicon substrate 101 is lower than the surface of the silicon substrate surface on which the emitter 104 is disposed. With this configuration, the total thickness of the insulating films 103, 106 which support the gate electrode 107 thereon is greater than the distance between the gate electrode 107 and the emitter 104.

The dielectric strength between the gate electrode 107 and the silicon substrate 101, which serves as an emitter electrode, is determined by the dielectric strength of the insulating films 103, 106 and the discharge-dependent dielectric strength of a cavity between the gate electrode 107 and the emitter 104. The dielectric strength between the gate electrode 107 and the emitter 104 is determined by discharges therebetween, and can be improved by increasing the degree of a vacuum while the field-emission cold cathode is in operation. A large current flowing upon discharges can be reduced by incorporating a resistance in the emitter 104. Since the total thickness of the insulating films 103, 106 can be established irrespective of the distance between the gate electrode 107 and the emitter 104, the dielectric strength of the insulating films 103, 106 can be made sufficiently high by selecting the total thickness of the insulating films 103, 106 such that the intensity of the electric field applied to the insulating films 103, 106 will be less than a disruptive field intensity.

Figure 14:
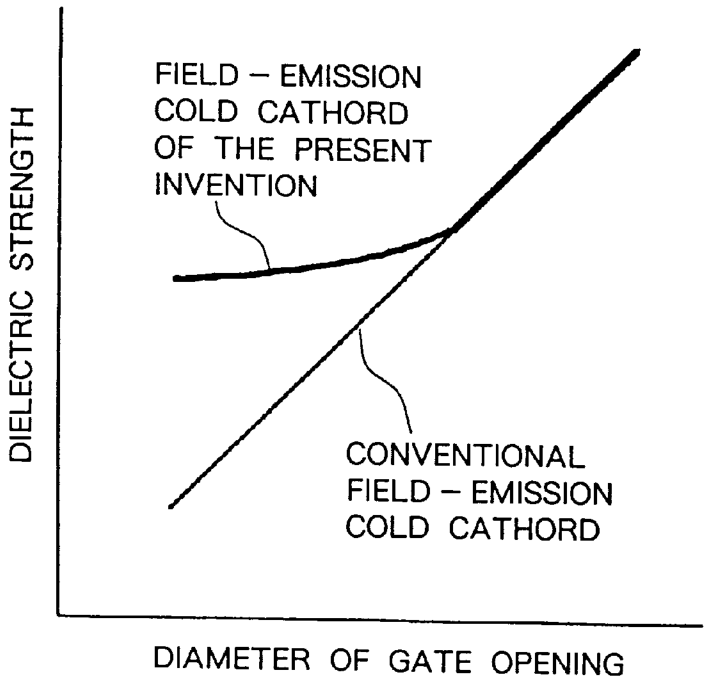
FIG. 14 is a graph showing the relationship the diameters of gate openings and the dielectric strengths of an inventive field-emission cold cathode and a conventional field-emission cold cathode.
Figure 15:
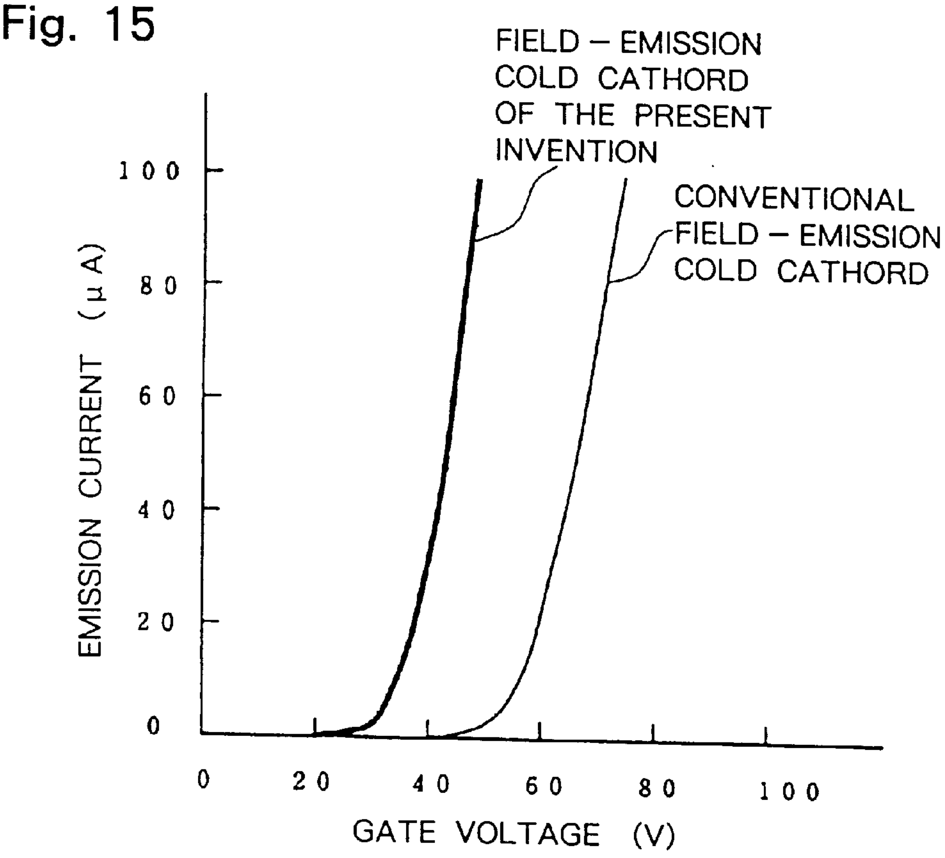
FIG. 15 is a graph showing the relationship between the gate voltages and emission currents of an inventive field-emission cold cathode and a conventional field-emission cold cathode.

FIG. 14 is a graph showing the relationship between the diameters of gate openings and the dielectric strengths of a field-emission cold cathode of this invention and a conventional field-emission cold cathode. As shown in FIG. 14, the dielectric strength of the conventional field-emission cold cathode decreases as the diameter of the gate opening decreases. However, a reduction in the dielectric strength of the field-emission cold cathode of this invention is minimized because the diameter of the gate opening can be reduced without changing the thickness of the insulating films. FIG. 15 is a graph showing the relationship between the gate voltages and emission currents of the field-emission cold cathode of this invention and a conventional field-emission cold cathode. It can be seen from FIG. 15 that the field-emission cold cathode of this invention can be operated at a voltage half the operating voltage of the conventional field-emission cold cathode because the diameter of the gate opening can be reduced.

A method of manufacturing the field-emission cold cathode shown in FIGS. 4 an 5 according to a first embodiment of the present invention will be described below with reference to FIGS. 6A–6D.

Figure 6A:
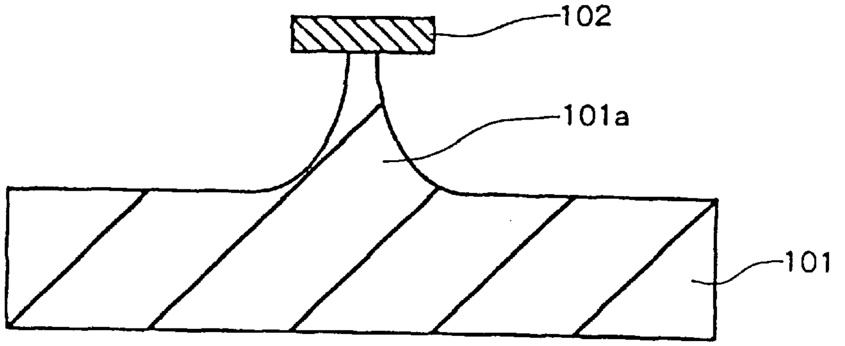
FIG. 6A is a schematic cross-sectional view illustrative of a method of manufacturing the field-emission cold cathode show in FIGS. 4 and 5, according to a first embodiment of the present invention, showing a stage in which a silicon substrate is etched to form a convex region, using a patterned insulating film on the silicon substrate as a mask.

As shown in FIG. 6A, an insulating film 102 having a thickness of about 300 nm is formed as a thermal oxide film on the surface of an n-type silicon substrate 101 having a concentration of about $10^{15}$ $cm^{-3}$. Then, the insulating film 102 is patterned to a circular shape having a diameter of about 0.5 $\mu$m by photolithography. Using the patterned insulating film 102 as a mask, the silicon substrate 101 is isotropically etched with an etching gas of SF6 or the like, forming a convex region 101*a* on the silicon substrate 101.

Figure 6B:
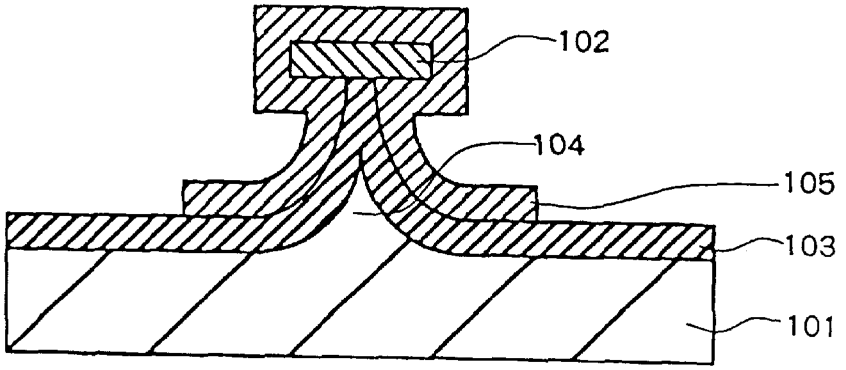
FIG. 6B is a schematic cross-sectional view illustrative of the method according to the first embodiment, showing a stage in which an oxide insulating film is formed on the silicon substrate and a nitride film is deposited and patterned to a predetermined shape.

Then, as shown in FIG. 6B, the silicon substrate 101 is thermally oxidized to form an oxide insulating film 103 having a thickness of about 100 nm. In this step, the convex region 101*a* has its tip end sharply pointed, forming an emitter 104. Then, a nitride film 105 is deposited on the entire surface formed so far by a CVD growth process in a vacuum, and thereafter patterned to a predetermined shape by photolithography as shown in FIG. 6B.

Figure 6C:
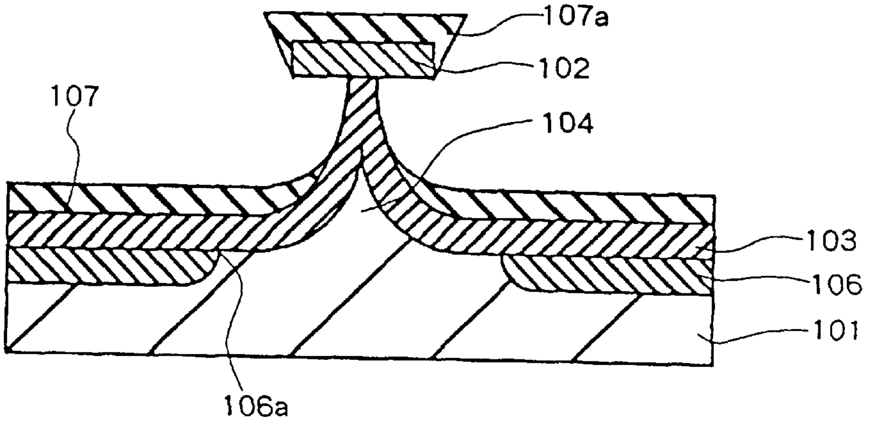
FIG. 6C is a schematic cross-sectional view illustrative of the method according to the first embodiment, showing a stage in which a second insulating film is formed in the silicon substrate using the patterned nitride film as a mask and a gate electrode material is deposited.

Then, as shown in FIG. 6C, using the patterned nitride film 105 as a mask, the silicon substrate 101 is thermally oxidized at an exposed area thereof beneath the insulating film 103, forming an oxide insulating film 106 having a thickness of about 300 nm. The insulating film 106 is disposed beneath the insulating film 103 and bounded by a silicon step 106*a* at its end. Then, the nitride film 105 is etched away by phosphoric acid or the like, after which a gate electrode material 107*a* of tungsten or the like is deposited to a thickness ranging from about 100 nm to 200 nm on the surface formed so far by oblique rotary electron beam evaporation, forming a gate electrode 107 on the insulating film 103.

Figure 6D:
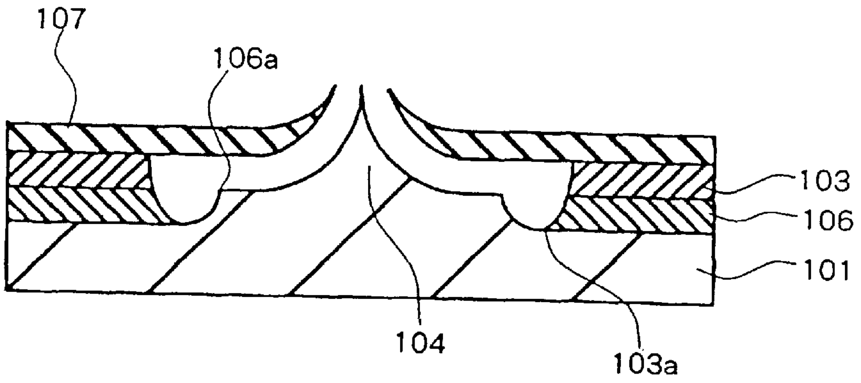
FIG. 6D is a schematic cross-sectional view illustrative of the method according to the first embodiment, showing a stage in which unwanted portions are removed by etching or the like, producing a field-emission cold cathode.

As shown in FIG. 6D, the insulating films 103, 106 are side-etched to an area outside of the silicon step 106*a* by hydrofluoric acid. The insulating film 102 and the gate electrode material 107*a* disposed thereon are lifted off, exposing the emitter 104, whereupon a field-emission cold cathode is completed.

With the above simple method according to the first embodiment, the thickness of the insulating films which support the gate electrode can be increased without changing the diameter of an opening in the gate electrode. Since the insulating films are formed as oxide films having a high dielectric strength, the diameter of the opening in the gate electrode can be reduced without lowering the dielectric strength of the insulating films. According to this method, because the gate electrode may be shaped so as not to be higher than the emitter, the intensity of the electric field applied to the tip end of the emitter is not reduced by the shape of the gate electrode.

A method of manufacturing the field-emission cold cathode shown in FIGS. 4 an 5 according to a second embodiment of the present invention will be described below with reference to FIGS. 7A–7D and 8A–8D. FIGS. 7A–7D show the first half of the method, and FIGS. 8A–8D show a last half of the method.

Figure 7A:
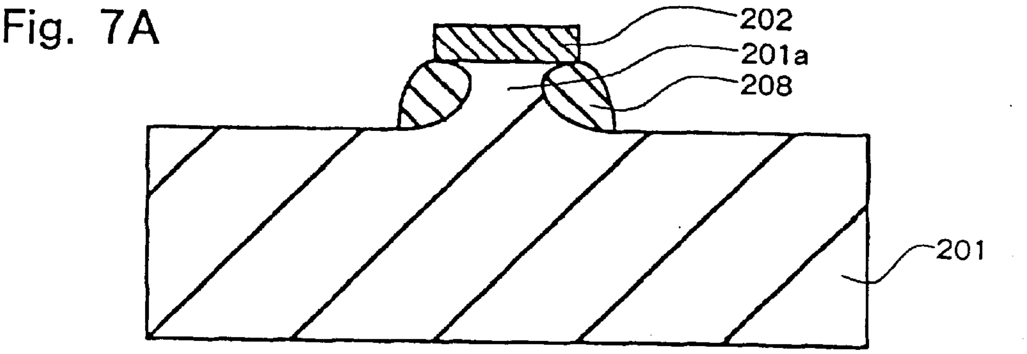
FIG. 7A is a schematic cross-sectional view illustrative of a method of manufacturing the field-emission cold cathode show in FIGS. 4 and 5, according to a second embodiment of the present invention, showing a stage in which a silicon substrate is thermally oxidized to form an oxide film using a patterned insulating film on the silicon substrate as a mask, and etched to form a convex region with the oxide film on its side walls.

As shown in FIG. 7A, an insulating film 202 having a thickness of about 500 nm is formed as a thermal nitride film on the surface of an n-type silicon substrate 201 having a concentration of about $10^{15}$ $cm^{-3}$. Then, the insulating film 202 is patterned to a desired shape by photolithography. Using the patterned insulating film 202 as a mask, the silicon substrate 201 is thermally oxidized to form an oxide film 208 having a thickness of about 200 nm, forming a convex region 201*a* on the silicon substrate 201. Then, the oxide film 208 is etched away by RIE, except on side walls of the convex region 201*a* on the silicon substrate 201.

Figure 7B:
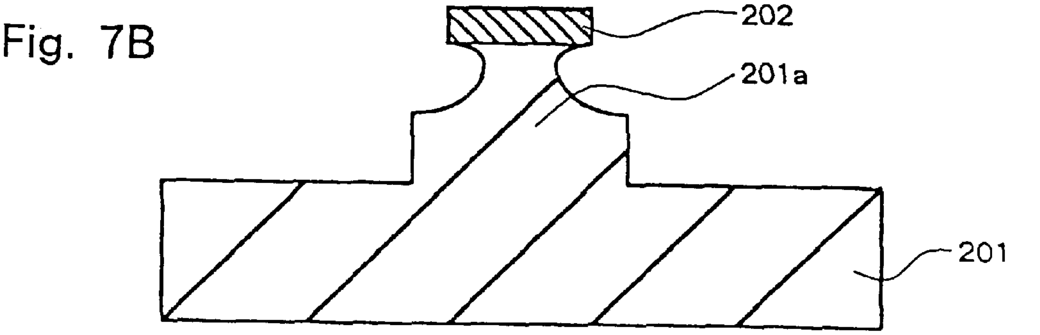
FIG. 7B is a schematic cross-sectional view illustrative of the method according to the second embodiment, showing a stage in which the silicon substrate is etched to adjust the height of the convex region, using the insulating film and the oxide film as a mask.

Thereafter, as shown in FIG. 7B, using the insulating film 202 and the oxide film 208 as a mask, the silicon substrate 201 is etched by RIE to adjust the height of the convex region 201*a*. In this step, the height of the tip end of an emitter 204 to be formed later and the height of a gate electrode 207 to be formed later are established.

Figure 7C:
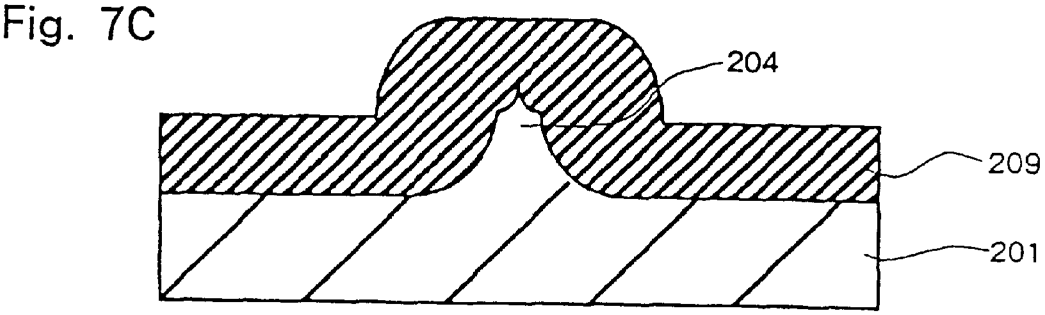
FIG. 7C is a schematic cross-sectional view illustrative of the method according to the second embodiment, showing a stage in which the insulating film is removed and the silicon substrate is thermally oxidized to form an emitter beneath an oxidized film.

As shown in FIG. 7C, the insulating film 202 is removed by phosphoric acid, after which the silicon substrate 201 is thermally oxidized until the convex region 201*a* is sharply pointed, thus forming an oxide film 209 having a thickness of about 300 nm on the silicon substrate 201. In this step, the convex region 201*a* serves as a sharply pointed emitter 204 formed on the silicon substrate 201.

Figure 7D:
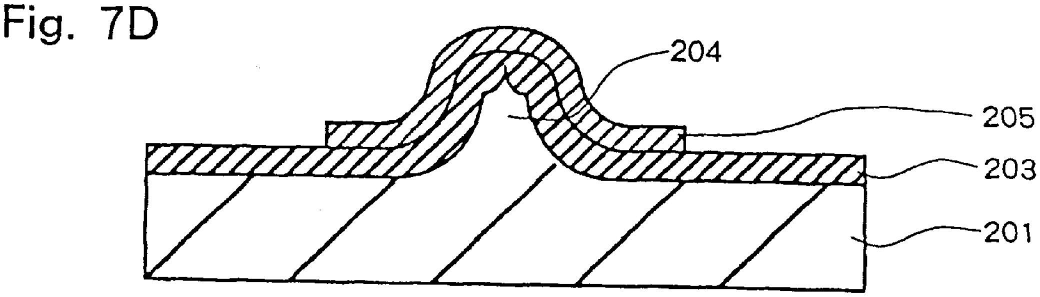
FIG. 7D is a schematic cross-sectional view illustrative of the method according to the second embodiment, showing a stage in which the oxide film is removed, an insulating film is formed, and a nitride film deposited on the insulating film is patterned.

Then, as shown in FIG. 7D, after the oxide film 209 is removed, the silicon substrate 201 is oxidized to a thickness ranging from 50 nm to 200 nm, forming an oxide insulating film 203 on the surface thereof. Thereafter, a nitride film 205 is deposited to a thickness of about 100 nm on the entire surface formed so far by CVD, and then patterned to a predetermined shape by photolithography.

Figure 8A:
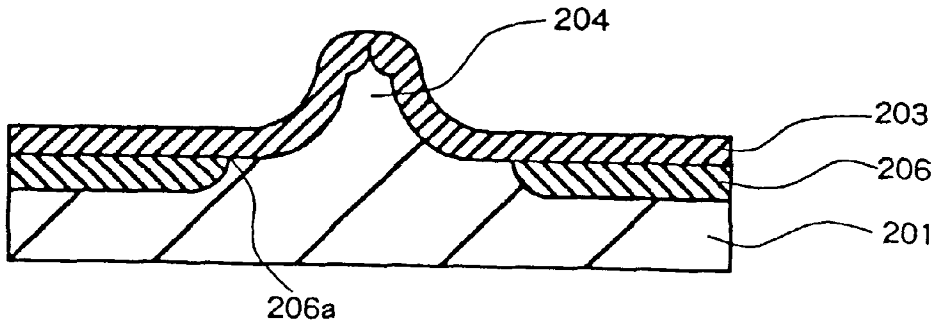
FIG. 8A is a schematic cross-sectional view illustrative of the method according to the second embodiment, showing a stage in which an insulating film is formed on the silicon substrate using the patterned nitride film as a mask and then the nitride film is removed.

Then, as shown in FIG. 8A, using the patterned nitride film 205 as a mask, the silicon substrate 201 is selectively thermally oxidized to form an oxide insulating film 206 having a thickness ranging from about 100 nm to 500 nm. Thereafter, the nitride film 205 is removed by an etching solution as of phosphoric acid. In this step, a silicon step 206*a* is formed on the silicon substrate 201 where it contacts the end of the insulating film 206 beneath the insulating film 203. The total thickness of the insulating films 203, 206 increases in an area spaced from the silicon step 206*a* around the emitter 204.

Figure 8B:
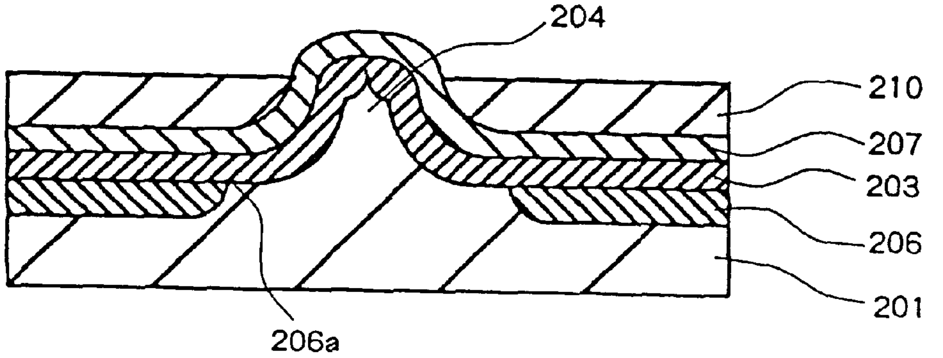
FIG. 8B is a schematic cross-sectional view illustrative of the method according to the second embodiment, showing a stage in which a gate electrode and a planarizing film are deposited and then etched back to expose the gate electrode on the emitter.

As shown in FIG. 8B, a gate electrode 207 in the form of a metal film of tungsten or the like is deposited to a thickness ranging from about 100 nm to 200 nm on the insulating film 203 by an evaporation or sputtering process. Then, a reflowable planarizing film 210 such as a BPSG film is deposited to a thickness ranging from 300 nm to 1000 nm on the surface formed so far. Thereafter, the gate electrode 207 and the planarizing film 210 are etched back to expose the gate electrode 207 on the emitter 204 from the planarizing film 210.

Figure 8C:
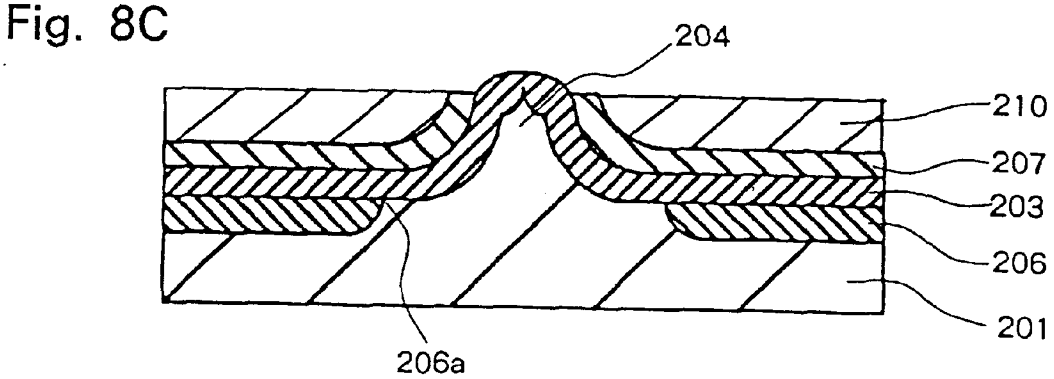
FIG. 8C is a schematic cross-sectional view illustrative of the method according to the second embodiment, showing a stage in which the exposed gate electrode is etched using the planarizing film as a mask, exposing the insulating film on the emitter.

Then, as shown in FIG. 8C, using the planarizing mask 210 as a mask, the exposed gate electrode 207 is etched by a gas of SF6 or the like, exposing the insulating film 203 on the emitter 204.

Figure 8D:
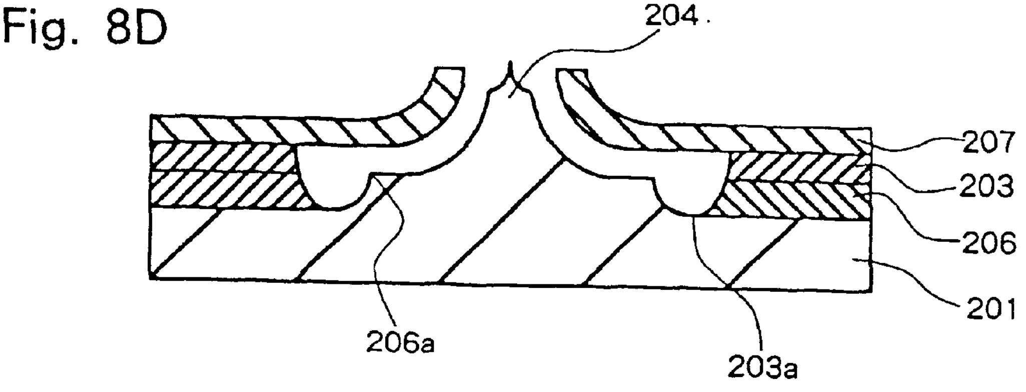
FIG. 8D is a schematic cross-sectional view illustrative of the method according to the second embodiment, showing a stage in which unwanted portions of the planarizing film and the insulating films are etched away, completing a field-emission cold cathode.

Finally, as shown in FIG. 8D, the planarizing film 210, the insulating film 203, and the insulating film 206 are etched by hydrofluoric acid to expose the tip end of the emitter 204 and position an insulating film end 203*a* outside of the silicon step 206*a,* thus completing a field-emission cold cathode.

In this embodiment, the insulating film 202 comprises a nitride film. However, the insulating film 202 may be of a two-layer structure comprising a lower nitride film and an upper oxide film disposed thereon, and the upper oxide film may be used as a mask for etching back the oxide film 208.

In the method according to the first embodiment, the emitter is formed by etching, and the opening in the gate electrode is formed by oblique evaporation and lift-off. In the method according to the second embodiment, the emitter is formed by oxidization, and the opening in the gate electrode is formed by etching-back.

A method of manufacturing the field-emission cold cathode shown in FIGS. 4 an 5 according to a third embodiment of the present invention will be described below with reference to FIGS. 9A–9D.

Figure 9A:
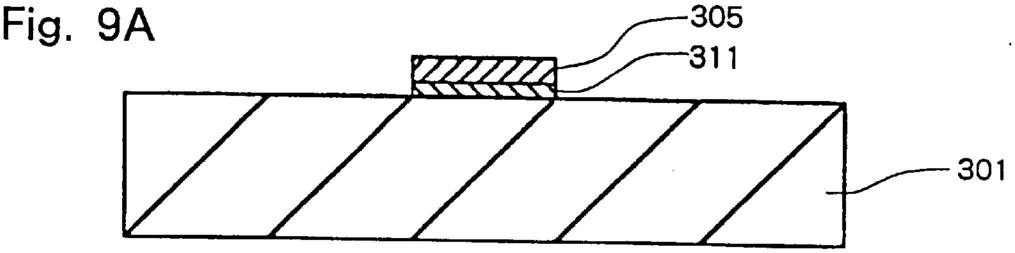
FIG. 9A is a schematic cross-sectional view illustrative of a method of manufacturing the field-emission cold cathode shown in FIGS. 4 and 5, according to a third embodiment of the present invention, showing a stage in which an oxide film and a nitride film are formed on a silicon substrate and then patterned.

As shown in FIG. 9A, an oxide film 311 having a thickness of about 50 nm is formed on an n-type silicon substrate 301 by thermal oxidization, and a nitride film 305 having a thickness of about 100 nm is formed on the oxide film 311 by CVD. Then, the oxide film 311 and the nitride film 305 are patterned to a predetermined shape by photolithography.

Figure 9B:
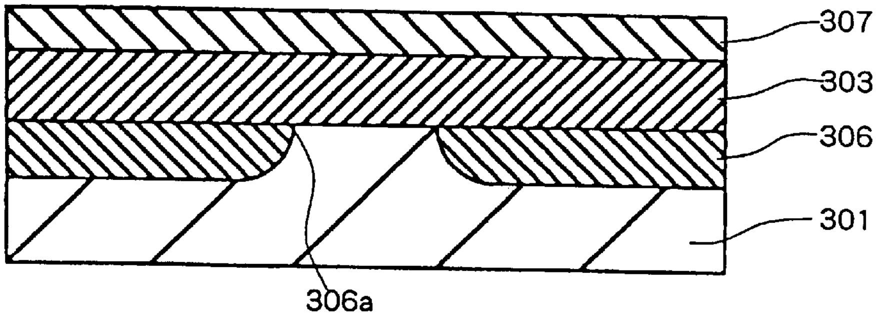
FIG. 9B is a schematic cross-sectional view illustrative of the method according to the third embodiment, showing a stage in which an oxide film is formed on the silicon substrate using the nitride film as a mask, the mask is removed, and thereafter an insulating film and a gate electrode are deposited.

As shown in FIG. 9B, using the nitride film 305 as a mask, the silicon substrate 301 is thermally oxidized to form an oxide insulating film 306 having a thickness ranging from about 100 nm to 500 nm. Then, the nitride film 305 and the oxide film 311 are removed by phosphoric acid and hydrofluoric acid. Thereafter, an oxide insulating film 303 having a thickness of about 200 nm is deposited by CVD, and then a gate electrode 307 is deposited to a thickness ranging from 100 nm to 200 nm by sputtering. When the insulating film 306 is formed, the shape of a silicon step 306*a* may be changed by changing the thickness of the oxide film 311. For example, if the thickness of the oxide film 311 is increased, then the silicon step 306*a* is of a more smooth shape, preventing an electric field from being applied to an edge of the silicon step 306*a* when the field-emission cold cathode is in operation. This also applies to the other embodiments.

Figure 9C:
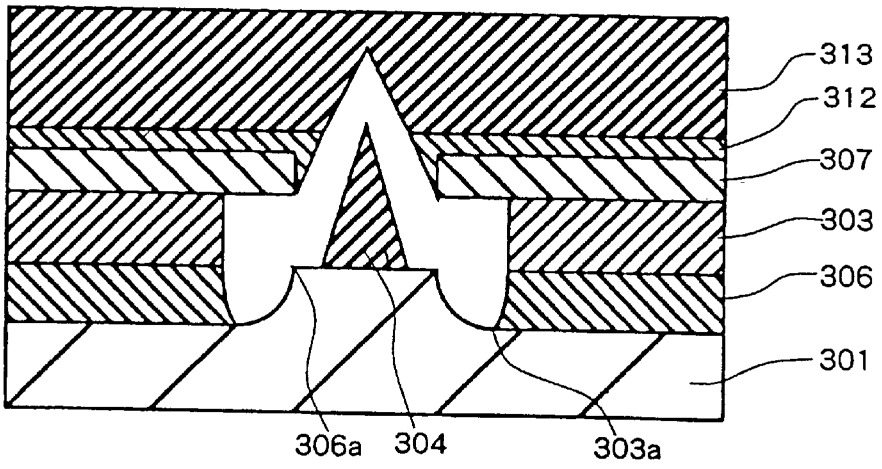
FIG. 9C is a schematic cross-sectional view illustrative of the method according to the third embodiment, showing a stage in which openings are formed in the gate electrode and the oxide film, two insulating films are laterally etched, a release layer is formed, and thereafter an emitter material layer is deposited.

As shown in FIG. 9C, openings having a diameter ranging from about 0.1 μm to 0.8 μm are formed in the gate electrode 307 and the insulating film 303 by photolithography and RIE. Thereafter, the insulating film 303 and the insulating film 306 are laterally etched by hydrofluoric acid according to wet etching. A release layer 312 of aluminum or the like is deposited by oblique evaporation, and thereafter an emitter material layer 313 of tungsten or the like is deposited by vertical evaporation. In this step, a sharply pointed emitter 304 is formed in the openings.

Figure 9D:
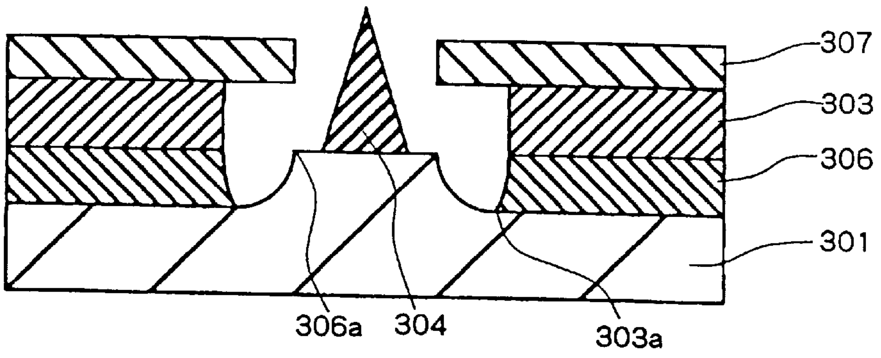
FIG. 9D is a schematic cross-sectional view illustrative of the method according to the third embodiment, showing a stage in which the release layer and the emitter material layer except an emitter are removed by etching or the like, completing a field-emission cold cathode.

As shown in FIG. 9D, the release layer 312 is etched by phosphoric acid to lift off the emitter material layer 313 on the release layer 312, exposing the emitter 304 thereby to complete a field-emission cold cathode.

The field-emission cold cathode can easily be manufactured by forming the emitter according to evaporation as described above. The thickness of the oxide film 311 may be controlled when the oxide film 306 is formed, or the silicon substrate 301 may be etched before the insulating film 311 is formed, so that the insulating film 306 will be planarized on the surface of the silicon substrate 301 upon oxidization. The gate electrode 307 may thus be planarized to stabilize an electric field applied to the emitter 304 for stable current characteristics.

Figure 10:
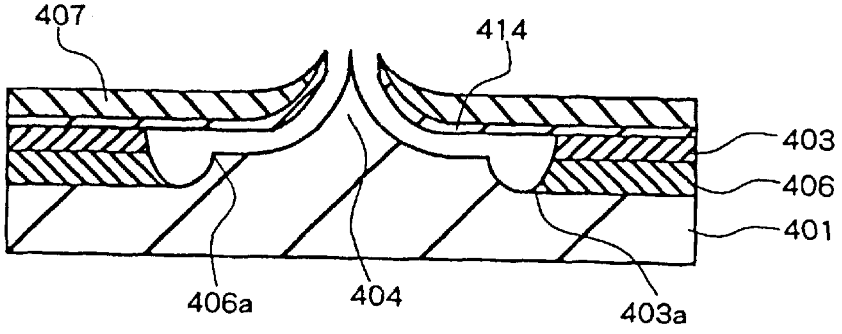
FIG. 10 is a schematic cross-sectional view of a field-emission cold cathode according to a second embodiment of the present invention.

A field-emission cold cathode according to a second embodiment of the present invention will be described below with reference to FIG. 10.

The field-emission cold cathode according to the second embodiment comprises an n-type silicon substrate 401 having a convex silicon step 406*a* and an emitter 404 on its upper surface, a gate electrode 407 of tungsten or the like disposed around the convex silicon step 106*a* and the emitter 404 and having a thickness ranging from about 100 nm to 200 nm, a nitride insulating film 414 disposed beneath the gate electrode 407 and having a thickness ranging from about 20 nm to 100 nm, an oxide insulating film 403 disposed beneath the insulating film 414 and having a thickness ranging from about 30 nm to 200 nm, and an oxide insulating film 406 disposed beneath the insulating film 403 and having a thickness ranging from 100 nm to 500 nm.

The emitter 404 is disposed inwardly of the silicon step 406*a,* and the insulating films 403, 406 have an insulating film end 403*a* disposed outwardly of the silicon step 406*a.* Since the insulating film 414 is disposed beneath the gate electrode 407, the creeping distance between the emitter 404 and the gate electrode 414 is greater than a value determined by the total thickness of the insulating films 403, 406. Accordingly, the dielectric strength related to the creeping distance is improved. Since the insulating film 414 comprises a nitride film and the insulating films 403, 406 comprise oxide films, they have different etching rates when etched by hydrofluoric acid. Therefore, a desired configuration can easily be obtained in one etching process.

A method of manufacturing a field-emission cold cathode according to a third embodiment of the present invention will be described below with reference to FIGS. 11A 11C.

Figure 11A:
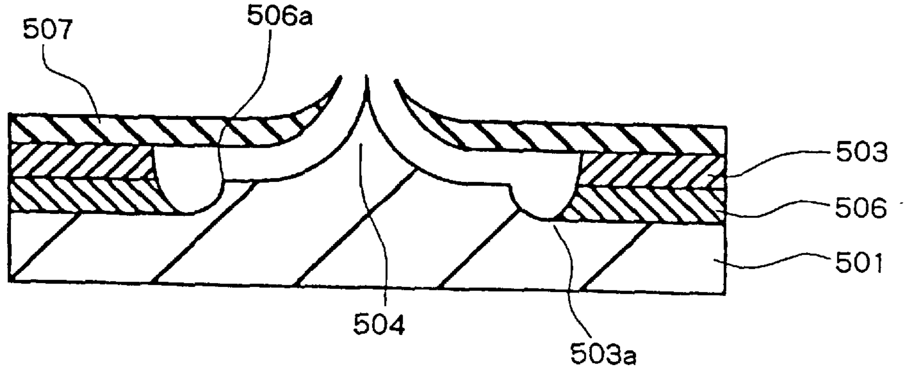
FIG. 11A is a schematic cross-sectional view illustrative of a method of manufacturing a field-emission cold cathode according to a third embodiment, showing the same structure as the field-emission cold cathode according to the first embodiment.

The structure shown in FIG. 11A is the same as the structure shown in FIG. 6D, and can be formed in the same manner as with the method according to the first embodiment of the present invention.

Figure 11B:
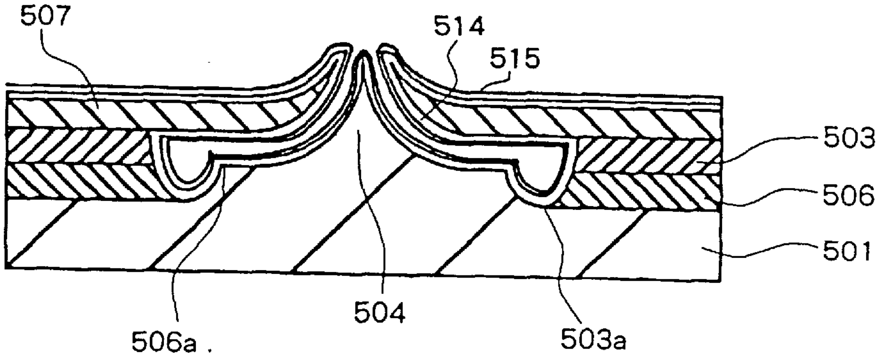
FIG. 11B is a schematic cross-sectional view illustrative of the method of manufacturing the field-emission cold cathode according to the third embodiment, showing a stage in which a nitride insulating film and an oxide film are formed on the surface formed so far.
Figure 11C:
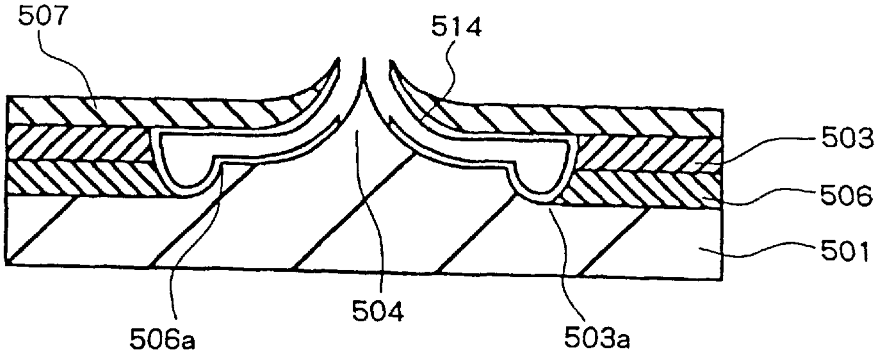
FIG. 11C is a schematic cross-sectional view illustrative of the method of manufacturing the field-emission cold cathode according to the third embodiment, showing a stage in which the oxide film except an area thereof covered with a gate electrode is removed, the insulating film is etched using the remaining oxide film as a mask, and the oxide film as the mask is removed, thus completing a field-emission cold cathode which has insulating films on opposing surfaces of the gate electrode and the silicon substrate.

As shown in FIG. 11B, a nitride insulating film 514 is formed to a thickness ranging from about 20 nm to 100 nm on the entire surface formed so far by a CVD growth process in a vacuum, and thereafter a thermal oxide film 515 having a thickness of about 5 nm is formed on the surface of the insulating film 514.

Figure 1A:
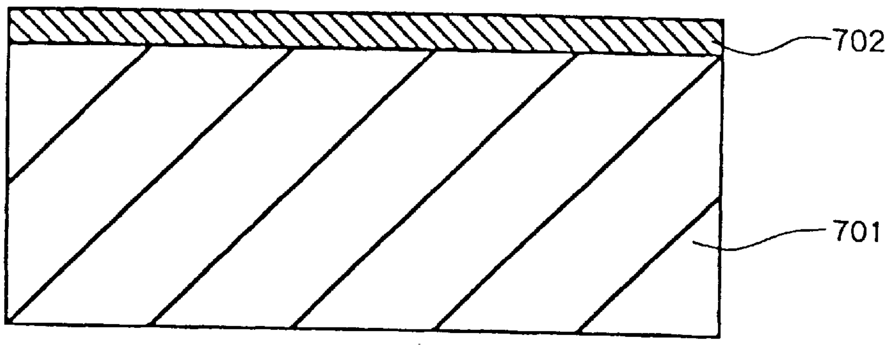
Fig. 1A Prior Art
FIG. 1A is a schematic cross-sectional view illustrative of a first conventional method of manufacturing a field-emission cold cathode as disclosed in Japanese laid-open patent publication No. 5-94762, showing a stage in which an insulating film is formed on a silicon substrate.
Figure 1B:
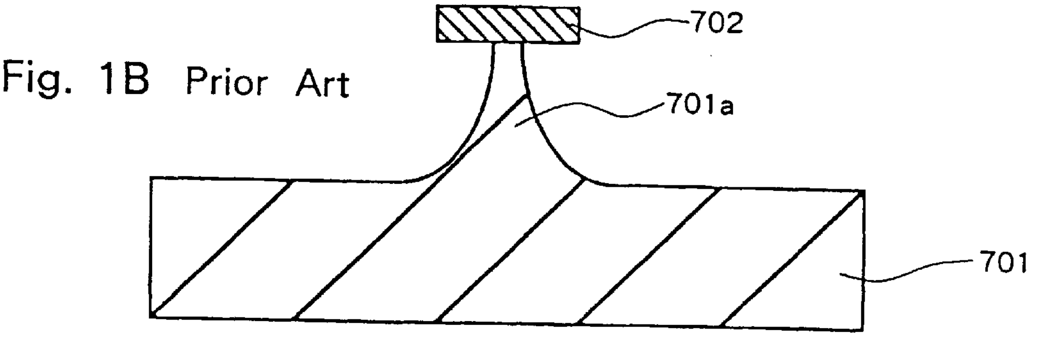
Fig. 1B Prior Art
FIG. 1B is a schematic cross-sectional view illustrative of the first conventional method, showing a stage in which the silicon substrate is etched to form a convex region, using the insulating film as a mask.
Figure 1C:
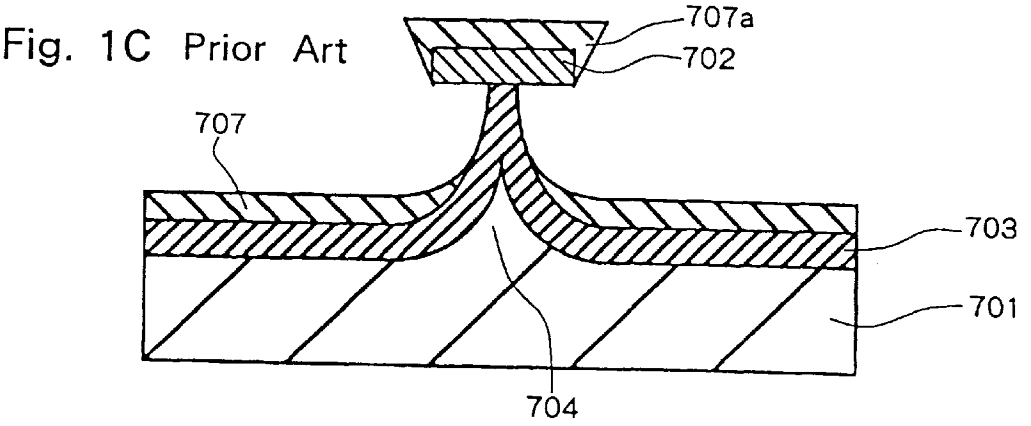
Fig. 1C Prior Art
FIG. 1C is a schematic cross-sectional view illustrative of the first conventional method, showing a stage in which an insulating film is formed on the silicon substrate and a gate electrode material is deposited.
Figure 1D:
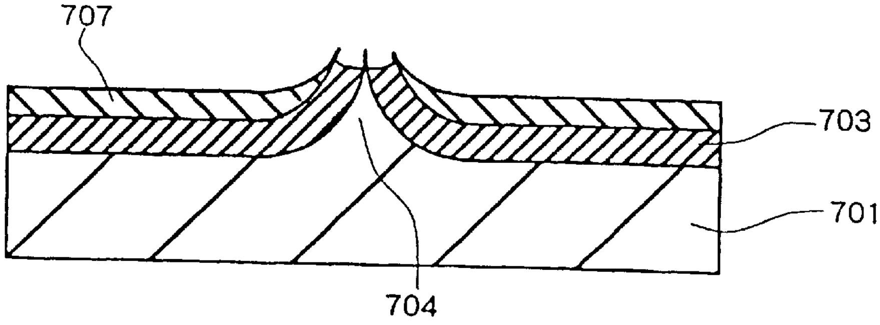
Fig. 1D Prior Art
FIG. 1D is a schematic cross-sectional view illustrative of the first conventional method, showing a stage in which unwanted portions are removed by etching or the like, producing a field-emission cold cathode.
Figure 2A:
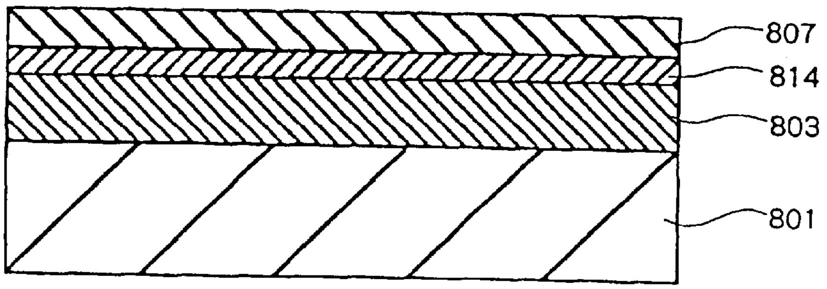
Fig. 2A Prior Art
FIG. 2A is a schematic cross-sectional view illustrative of a second conventional method of manufacturing a field-emission cold cathode as disclosed in Japanese laid-open patent publication No. 8-321255, showing a stage in which insulating films and a gate electrode are formed on a silicon substrate.
Figure 2B:
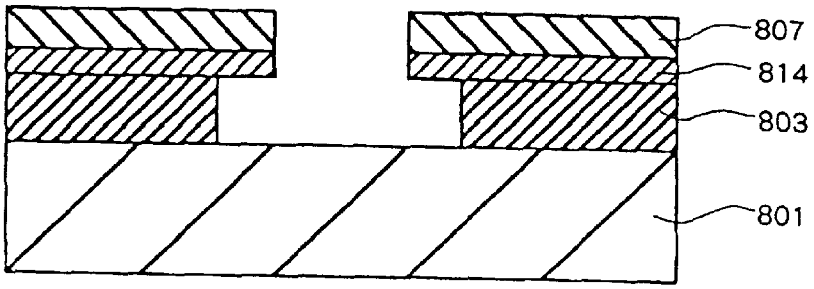
Fig. 2B Prior Art
FIG. 2B is a schematic cross-sectional view illustrative of the second conventional method, showing a stage in which the insulating films and the gate electrode are etched to form openings therein, and the edge of the opening in one of the insulating films is retracted away from the edges of the other openings.
Figure 2C:
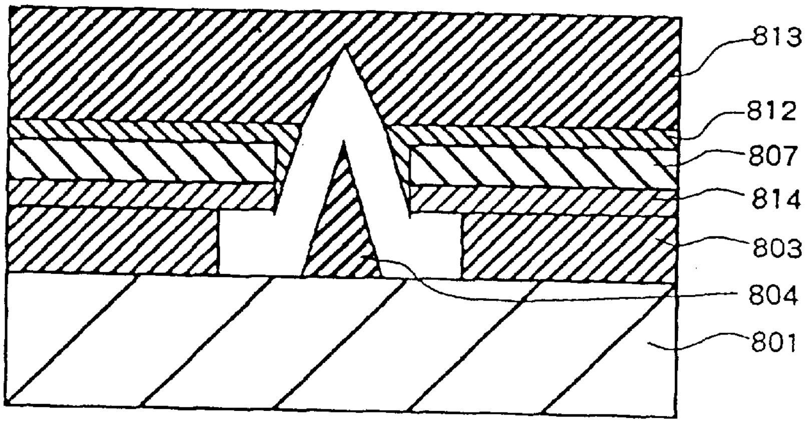
Fig. 2C Prior Art
FIG. 2C is a schematic cross-sectional view illustrative of the second conventional method, showing a stage in which a release layer is formed and an emitter material layer is deposited.
Figure 2D:
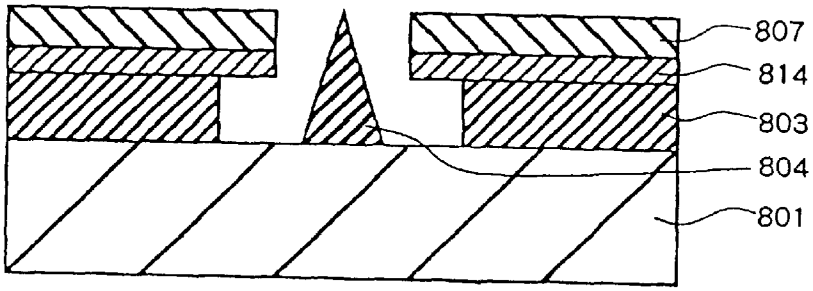
Fig. 2D Prior Art
FIG. 2D is a schematic cross-sectional view illustrative of the second conventional method, showing a stage in which unwanted portions are removed by etching or the like, producing a field-emission cold cathode.
Figure 3A:
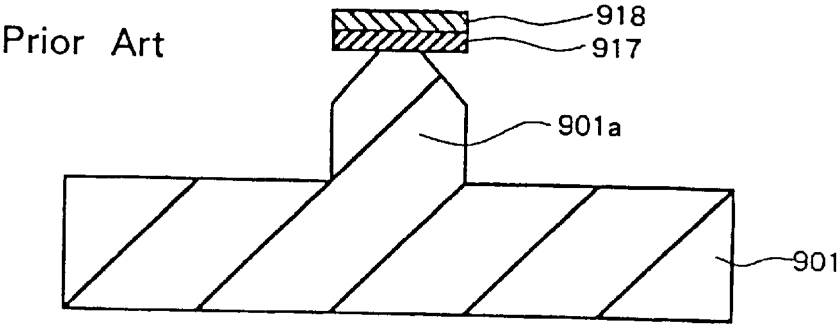
Fig. 3A Prior Art
FIG. 3A is a schematic cross-sectional view illustrative of a third conventional method of manufacturing a field-emission cold cathode as disclosed in Japanese laid-open patent publication No. 7-65706, showing a stage in which a nitride film and an oxide film are deposited on a silicon substrate and the silicon substrate is isotropically and anisotropically etched, forming a convex region on the silicon substrate.
Figure 3B:
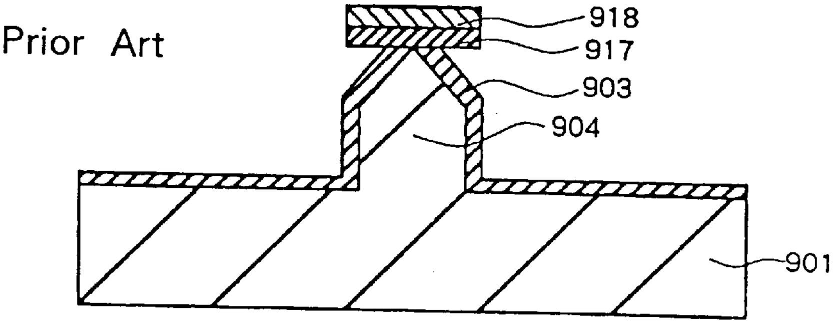
Fig. 3B Prior Art
FIG. 3B is a schematic cross-sectional view illustrative of the third conventional method, showing a stage in which an insulating film is formed on the silicon substrate by thermal oxidization.
Figure 3C:
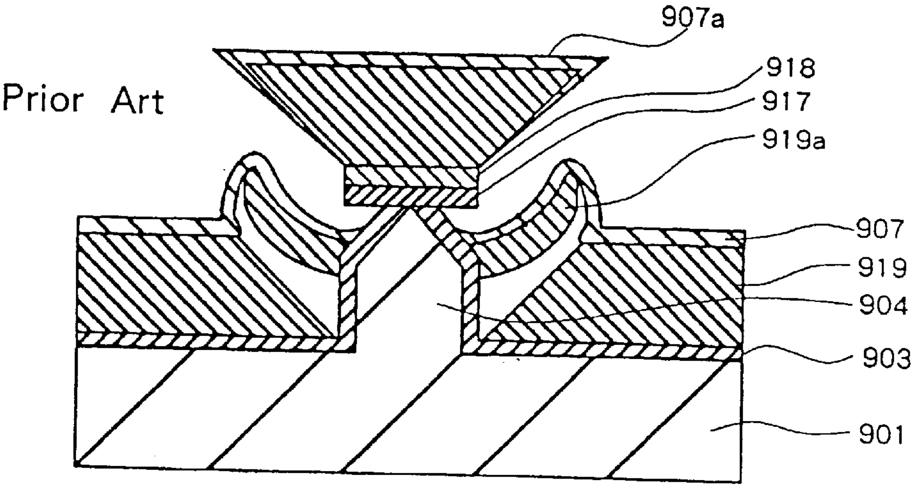
Fig. 3C Prior Art
FIG. 3C is a schematic cross-sectional view illustrative of the third conventional method, showing a stage in which an insulating film is deposited by evaporation to form a collar-like growth portion, and a gate electrode material is deposited.
Figure 3D:
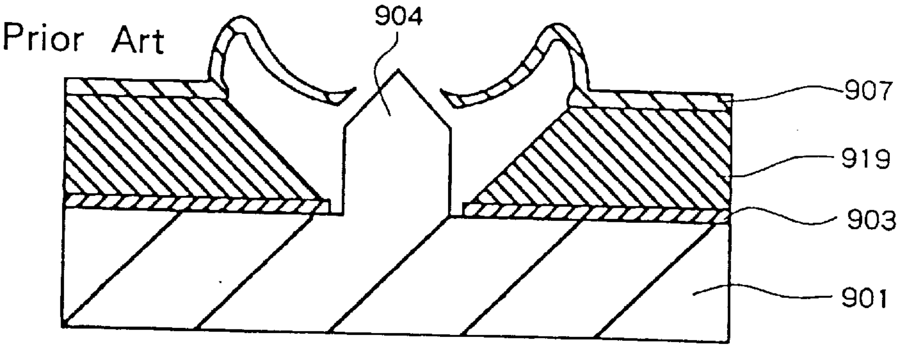
Fig. 3D Prior Art
FIG. 3D is a schematic cross-sectional view illustrative of the third conventional method, showing a stage in which unwanted portions are removed by etching or the like, producing a field-emission cold cathode.

Then, as shown in FIG. 1C, the oxide film 515 except an area thereof covered with a gate electrode 507 is removed by anisotropic etching. Using the remaining oxide film 515 as a mask, the insulating film 514 is etched by phosphoric acid, and the oxide film 515 as the mask is etched away by hydrofluoric acid, thus completing a field-emission cold cathode which has insulating films on opposing surfaces of the gate electrode and the silicon substrate.

The field-emission cold cathode according to the third embodiment has a longer creeping distance than the field-emission cold cathode according to the second embodiment, providing an increased dielectric strength.

Figure 12:
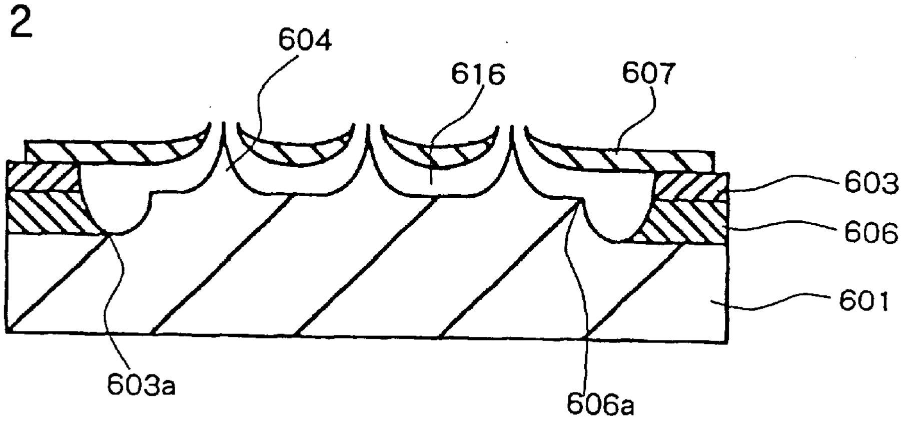
FIG. 12 is a schematic cross-sectional view of a field-emission cold cathode according to a fourth embodiment of the present invention, taken along line XII—XII of FIG. 13.
Figure 13:
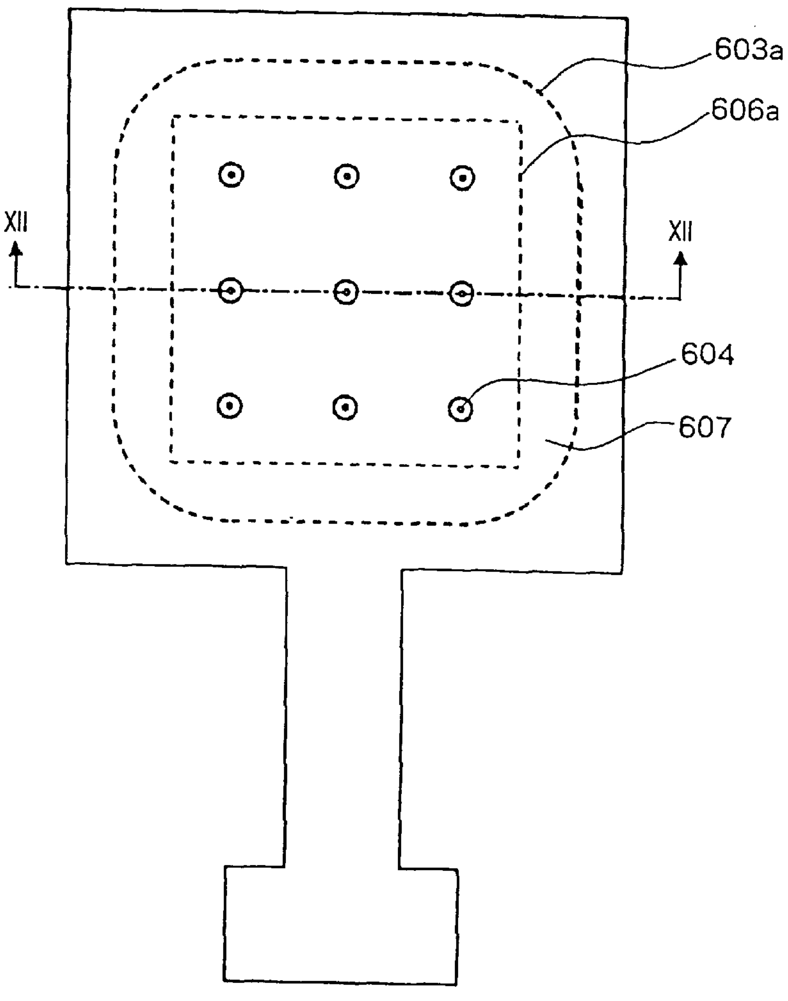
FIG. 13 is a plan view of the field-emission cold cathode shown in FIG. 12.

A field-emission cold cathode according to a fourth embodiment will be described below with reference to FIGS. 12 and 13.

In each of the above embodiments, the field-emission cold cathode has a single emitter. According to the fourth embodiment, the field-emission cold cathode has an array of emitters. The field-emission cold cathode according to the fourth embodiment comprises an n-type silicon substrate 601 having a convex step 606*a* and an plurality of sharply pointed emitters 504 on its upper surface, a gate electrode 607 of tungsten or the like having openings defined around the emitters 504 and having a thickness ranging from about 100 nm to 200 nm, an insulating film 603 disposed around the silicon step 606*a* and having a thickness ranging from about 30 nm to 200 nm, and an oxide insulating film 606 disposed around the silicon step 606*a* and having a thickness ranging from about 100 nm to 500 nm.

A cavity 616 is defined below the gate electrode 607 between the emitters 604. As shown in FIG. 13, the silicon step 606*a* is disposed around the outer emitters 604, and an oxide film end 603*a* is disposed outwardly of the silicon step 606*a*. Even if the pitch is of a small value of 2 $\mu$m or less, the region below the gate electrode 607 between the emitters 604 maintains a desired dielectric strength because a cavity is defined in that region though the distance between the silicon substrate 601 and the gate electrode 607 is small. The region which supports the gate electrode 607 maintains a desired dielectric strength due to the total thickness of the insulating films 603, 606. Therefore, the field-emission cold cathode is of a high dielectric strength.

In the illustrated embodiment, the cavity 616 is defined in and around the entire array of emitters 604. However, emitters may be divided and disposed in regions surrounded by a plurality of oxide film steps 603*a* in order to prevent the gate electrode 607 from being curved downwardly by gravity.

If the field-emission cold cathode according to the fourth embodiment is incorporated as an electron gun in a display device, then an anode layer having a phosphor layer is disposed in confronting relation to the array of emitters, and emits light when exposed to electrons radiated from the emitters.

If a field-emission cold cathode is incorporated as an electron gun in a display device, then since it is required to be usually operated in a vacuum, it cannot easily be replaced when an insulation failure occurs once the electron gun is incorporated in the display device. There has been a demand for a field-emission cold cathode that can operate under a low voltage, for use in flat display panels because the low operating voltage is effective in reducing the power requirement of the drive circuit of flat display panels. If a field-emission cold cathode according to the present invention is applied to a flat display panel, then a plurality of electrons can operate under a low voltage without current variations, and flat display panel can operate for displaying images with a low power requirement for a long service life. The field-emission cold cathode according to the present invention is also applicable to display cathode-display tubes (CRT).

As described above, the field-emission cold cathode according to the present invention has a high dielectric strength and can operate under a low voltage.

Because a cavity is defined near the emitter between the emitter and the gate electrode, and the thickness of the insulating film which supports the gate electrode may be greater than the distance between the emitter and the gate electrode across the cavity, the dielectric strength is prevented from being lowered even when the size is reduced by reducing the distance between the emitter and the gate electrode. The operating voltage of the field-emission cold cathode can thus be lowered when its size is reduced.

Furthermore, if an insulating film is formed on at least one of the gate electrode and the silicon substrate within the cavity near the emitter, then the creeping distance of the insulating film between the silicon substrate and the gate electrode is increased, increasing the dielectric strength between the emitter and the gate electrode along the surface therebetween.

With the method according to the present invention, the step of selectively oxidizing the silicon substrate is added to the conventional method to produce a field-emission cold cathode. Since the surface of the insulating film is planarized, the gate electrode is also planarized, allowing the field-emission cold cathode to have stable current characteristics.

If the field-emission cold cathode according to the present invention, which has a high dielectric strength and can operate under a low voltage, is incorporated in a display device, e.g., a flat display panel, a display cathode-ray tube, or the like, then the display device has stable current characteristics.

It is to be understood, however, that although the characteristics and advantages of the present invention have been set forth in the foregoing description, the disclosure is illustrative only, and changes may be made in the arrangement of the parts within the scope of the appended claims.

What is claimed is:

1. A method of manufacturing a field-emission cold cathode having a substrate having a sharply pointed emitter disposed on a surface thereof and serving as an emitter electrode, an insulating film disposed on said substrate, and a gate electrode disposed on said insulating film and having an opening defined therein and having an edge surrounding said emitter, said method comprising the steps of:

forming a convex region on a silicon substrate using a mask disposed on said silicon substrate;

forming a second oxide film as an insulating film on the surface of said silicon substrate to form a sharply pointed emitter from said convex region beneath said second oxide film;

forming a first oxide film as an insulating film in said silicon substrate beneath said second oxide film, using a mask disposed on said second oxide film, said first oxide film having an inner end providing a step on said silicon substrate;

forming a gate electrode on said second oxide film and having an opening defined therein and having an edge surrounding said emitter; and selectively etching said first oxide film and said second oxide film laterally in said opening to a position beyond said step for thereby defining a cavity between said gate electrode and said silicon substrate.

2. A method according to claim 1, further comprising the steps of:

before forming the gate electrode on said second oxide film, forming a third insulating film on said second oxide film, said third insulating film having a different etching rate from said second oxide film; and forming said gate electrode on said third insulating film.

3. A method according to claim 1, further comprising the steps of:

after defining the cavity between said gate electrode and said silicon substrate, forming a fourth insulating film on an entire surface formed so far; and selectively removing a portion of said fourth insulating film except an area thereof which is deposited on a surface in said cavity outwardly of said opening.

4. A method of manufacturing a field-emission cold cathode having a substrate having a sharply pointed emitter disposed on a surface thereof and serving as an emitter electrode, an insulating film disposed on said substrate, and a gate electrode disposed on said insulating film and having an opening defined therein and having an edge surrounding said emitter, said method comprising the steps of:

forming a first oxide film as an insulating film in a silicon substrate, using a mask disposed on said silicon substrate, said first oxide film having an inner end providing a step on said silicon substrate;

forming a second oxide film as an insulating film on said silicon substrate over said first oxide film;

forming a gate electrode on said second oxide film;

defining an opening in said second oxide film and said gate electrode;

selectively etching said first oxide film and said second oxide film laterally in said opening to a position beyond said step for thereby defining a cavity between said gate electrode and said silicon substrate; and depositing an emitter material on said silicon substrate below said opening through said opening for thereby forming an emitter in said opening.

5. A method according to claim 4, further comprising the steps of:

before forming the gate electrode on said second oxide film, forming a third insulating film on said second oxide film, said third insulating film having a different etching rate from said second oxide film; and forming said gate electrode on said third insulating film.

6. A method according to claim 4, further comprising the steps of:

after defining the cavity between said gate electrode and said silicon substrate, forming a fourth insulating film on an entire surface formed so far; and selectively removing a portion of said fourth insulating film except an area thereof which is deposited on a surface in said cavity outwardly of said opening.

* * * * *